United States Patent
McNeil, Jr. et al.

(10) Patent No.: US 11,663,104 B2
(45) Date of Patent: *May 30, 2023

(54) THRESHOLD VOLTAGE DISTRIBUTION ADJUSTMENT FOR BUFFER

(71) Applicant: Micron Technology, Inc., Boise, ID (US)

(72) Inventors: Jeffrey S. McNeil, Jr., Nampa, ID (US); Niccolo' Righetti, Boise, ID (US); Kishore K. Muchherla, Fremont, CA (US); Akira Goda, Boise, ID (US); Todd A. Marquart, Boise, ID (US); Mark A. Helm, Santa Cruz, CA (US); Gil Golov, Backnang (DE); Jeremy Binfet, Boise, ID (US); Carmine Miccoli, Boise, ID (US); Giuseppina Puzzilli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/691,957

(22) Filed: Mar. 10, 2022

(65) Prior Publication Data

US 2022/0197771 A1 Jun. 23, 2022

Related U.S. Application Data

(63) Continuation of application No. 16/995,246, filed on Aug. 17, 2020, now Pat. No. 11,288,160.

(51) Int. Cl.
*G06F 11/30* (2006.01)
*G06F 11/07* (2006.01)
*G06F 1/30* (2006.01)
(Continued)

(52) U.S. Cl.
CPC ............ *G06F 11/3058* (2013.01); *G06F 1/30* (2013.01); *G06F 11/076* (2013.01);
(Continued)

(58) Field of Classification Search
CPC ...... G06F 11/3058; G06F 1/30; G06F 11/076; G06F 11/0772; G06F 11/0787;
(Continued)

(56) References Cited

U.S. PATENT DOCUMENTS 8,849,104 B2    9/2014 Eder
8,879,320 B2 *  11/2014 Lee ..................... G11C 11/5628
                                              365/185.03

(Continued)

FOREIGN PATENT DOCUMENTS

KR            101540795 B1     7/2015

OTHER PUBLICATIONS

International Search Report and Written Opinion from related PCT Application No. PCT/US2021/044498, dated Nov. 26, 2021, 9 pages.

*Primary Examiner* — Tri M Hoang
(74) *Attorney, Agent, or Firm* — Brooks, Cameron & Huebsch, PLLC (57) ABSTRACT

A method includes writing received data sequentially to a particular location of a cyclic buffer of a memory device according to a first set of threshold voltage distributions. The method further includes performing a touch up operation on the particular location by adjusting the first set of threshold voltage distributions of the data to a second set of threshold voltage distributions in response to a determination that a trigger event has occurred. The second set of threshold voltage distributions can have a larger read window between adjacent threshold voltage distributions of the second set than that of the first set of threshold voltage distributions.

20 Claims, 7 Drawing Sheets

(51) Int. Cl.
*G11C 5/14* (2006.01)
*G11C 16/34* (2006.01)

(52) U.S. Cl.
CPC ...... *G06F 11/0772* (2013.01); *G06F 11/0787* (2013.01); *G06F 11/3037* (2013.01); *G11C 5/141* (2013.01); *G11C 16/3404* (2013.01); *G11C 16/3418* (2013.01); *G06F 2201/84* (2013.01)

(58) Field of Classification Search
CPC ............. G06F 11/3037; G06F 2201/84; G11C 5/141; G11C 16/3404; G11C 16/3418
See application file for complete search history.

(56) References Cited

U.S. PATENT DOCUMENTS

| | | | | |
|---|---|---|---|---|
| 9,330,775 B2* | 5/2016 | Kim | ................... | G11C 11/5642 |
| 9,368,223 B2* | 6/2016 | Jung | ................... | G11C 11/5671 |
| 9,418,731 B1* | 8/2016 | Watanabe | ........... | G11C 11/5628 |
| 9,595,342 B2* | 3/2017 | Pang | ................... | G11C 11/5621 |
| 9,715,341 B2 | 7/2017 | Kim et al. | | |
| 9,858,014 B2 | 1/2018 | Kim | | |
| 9,921,749 B2 | 3/2018 | Kim et al. | | |
| 10,055,267 B2 | 8/2018 | Agarwal et al. | | |
| 10,274,948 B2 | 4/2019 | Penilla et al. | | |
| 10,566,052 B2* | 2/2020 | Mirichigni | ......... | G11C 13/0004 |
| 10,755,785 B2* | 8/2020 | Hong | ................. | G11C 16/3454 |
| 10,861,557 B2 | 12/2020 | Kondo | | |
| 11,145,357 B2* | 10/2021 | Kim | ...................... | G11C 11/409 |
| 11,270,766 B2* | 3/2022 | Kim | ...................... | G11C 11/5642 |
| 11,288,160 B2* | 3/2022 | McNeil, Jr. | ......... | G06F 11/3037 |
| 2008/0285352 A1 | 11/2008 | Cho et al. | | |
| 2012/0005558 A1 | 1/2012 | Steiner et al. | | |
| 2014/0281808 A1 | 9/2014 | Lam | | |
| 2019/0156904 A1 | 5/2019 | Hong | | |
| 2019/0196562 A1 | 6/2019 | Grimsrud et al. | | |
| 2019/0311772 A1 | 10/2019 | Diep et al. | | |

\* cited by examiner

THRESHOLD VOLTAGE DISTRIBUTION ADJUSTMENT FOR BUFFER

PRIORITY INFORMATION

This application is a Continuation of U.S. application Ser. No. 16/995,246, filed Aug. 17, 2020, which issued as U.S. Pat. No. 11,288,160 on Mar. 29, 2022, the contents of which are included herein by reference.

TECHNICAL FIELD

Embodiments of the disclosure relate generally to memory systems and more specifically relate to threshold voltage distribution adjustment for buffer

BACKGROUND

A memory system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices, such as memory devices that store data. The host system can provide data to be stored at the memory sub-system and can request data to be retrieved from the memory sub-system.

The memory sub-system can be used for storage of data by various components of the vehicle, such as applications that are run by a host system of the vehicle. One examples of such an application is an event recorder of the vehicle. The event recorder may also be referred to as a "black box" or accident data recorder.

The emergence of autonomous vehicles, Internet of Things (IoT) and surveillance devices has resulted in a wider gap in between the total bytes written (TBW) in a useable lifetime of a memory sub-system and a user capacity of the memory sub-system. For example, the TBW to user capacity ratio for some memory systems used for such applications has increased by one to three orders of magnitude. Some autonomous vehicles require real time buffering of telemetric data such as video cameras, radar, lidar, ultra-sonic and other sensors that are necessary to playback the sequences preceding an accident. The data from various sensors sums up to a substantial throughput requirement per unit time (e.g., 1 gigabyte per second (GB/sec) sequential write throughput from a host). Upon a trigger event, a quantity of data corresponding to a predetermined playback time immediately preceding the event needs to be captured (e.g., to determine the cause of an accident). The recorded telemetric sensor data corresponding to the predetermined playback time can be referred to as a "snapshot". An event recorder is one such application in where the user capacity requirement could be as low as one hundred and twenty-eight (128) GB, but the TBW requirement could be as high as hundreds of Peta Bytes. The examples of values given are not limiting but highlight the relative difference between the requirements for capacity and TBW. An event recorder may need to store at least a few, most recent snapshots.

The event recorder can have multiple operating targets. An operating target for storage for the cyclic buffer can be significant write performance for large TBW where memory cell endurance is important because the memory cells will be subject to many program/erase cycles. Meanwhile, an operating target for the snapshot relatively high reliability. Accordingly, it is desirable to achieve both operating targets depending on whether data can be characterized as buffer or snapshot data, which has been substantially challenging in previous approaches.

Aspects of the present disclosure address the above and other deficiencies by achieving various operating targets for a cyclic buffer and a snapshot of a memory sub-system by, for example, flexibly adjusting various programming characteristic of data stored in the event recorder. For example, a vehicle can include a memory sub-system, such as a solid state drive (SSD). The memory sub-system can be used for storage of data by various components of the vehicle, such as applications that are run by a host system of the vehicle. One example of such an application is a event recorder of the vehicle. The event recorder can store sequentially received monitored telemetric data as a cyclic buffer. The event recorder can read and further program a subset of the telemetric data for the playback as a snapshot. A relatively high reliability of data is required for the snapshot as compared to the cyclic buffer. In response to the trigger event, embodiments described herein can adjust a programming characteristic of the data of the cyclic buffer to increase its reliability and store it as the snapshot without making the adjustment substantially time-consuming. For example, the embodiments described herein can adjust the programming characteristic of the data without physically erasing the data and/or moving the data to a different location. The snapshot does not refer to a reserved or different subset of the memory cells of the memory device, but refers to any memory cells of the cyclic buffer that are subjected to additional programming as part of a touch up operation to become a snapshot.

The figures herein follow a numbering convention in which the first digit or digits correspond to the drawing figure number and the remaining digits identify an element or component in the drawing. Similar elements or components between different figures can be identified by the use of similar digits. For example, 106 can reference element "06" in FIG. 1, and a similar element can be referenced as 606 in FIG. 6. Analogous elements within a Figure may be referenced with a hyphen and extra numeral or letter. Such analogous elements may be generally referenced without the hyphen and extra numeral or letter. For example, elements 504-1, 504-2, and 504-R in FIG. 5 may be collectively referenced as 504. As used herein, the designators "B", "N", "P", "R", and "S", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

Figure 1:
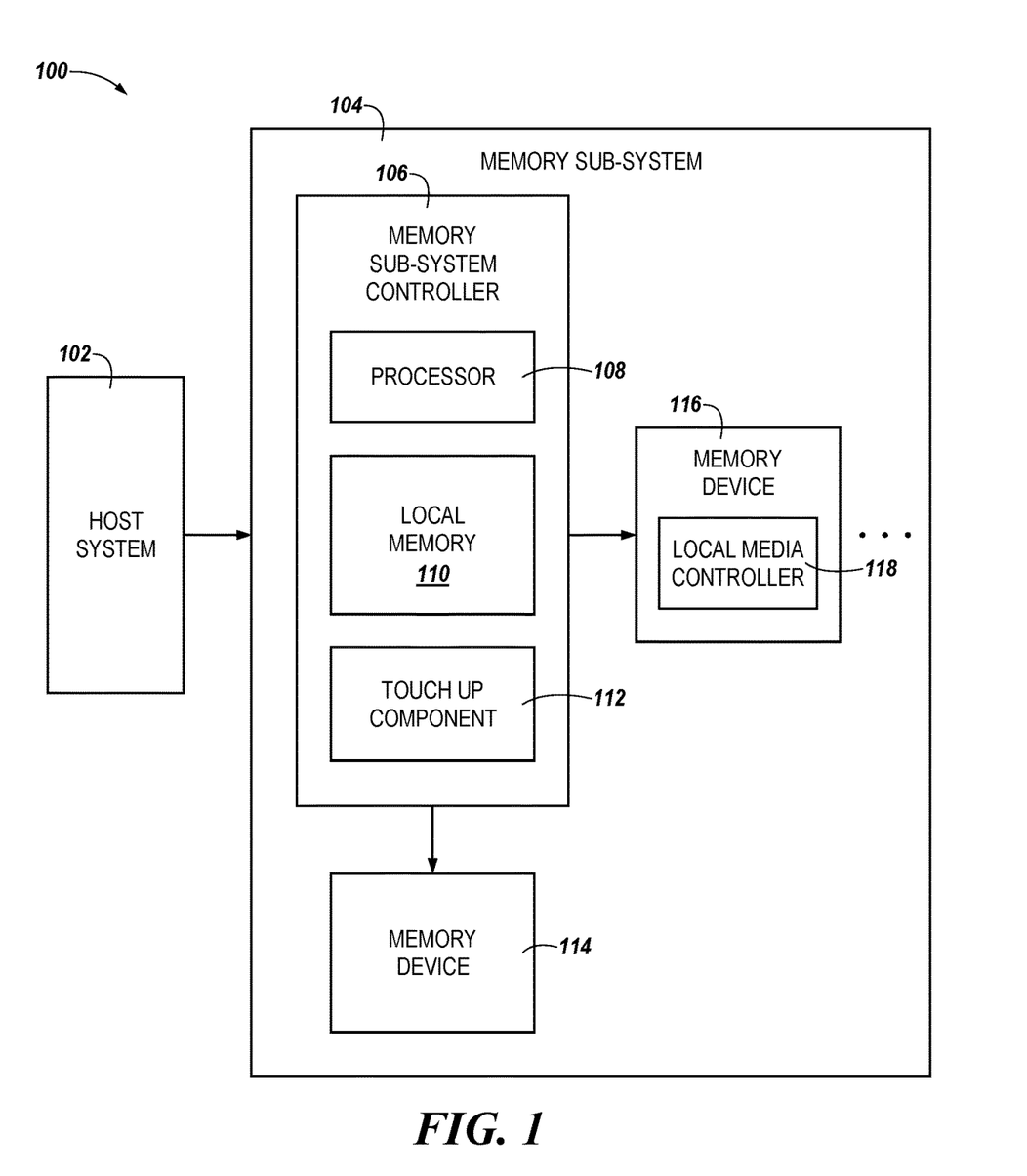
FIG. 1 illustrates an example computing system that includes a memory sub-system in accordance with some embodiments of the present disclosure.

FIG. 1 illustrates an example computing system 100 that includes a memory sub-system 104 in accordance with some embodiments of the present disclosure. The memory sub-system 104 can include media, such as one or more volatile memory devices (e.g., memory device 114), one or more non-volatile memory devices (e.g., memory device 116), or a combination of such.

A memory sub-system 104 can be a storage device, a memory module, or a hybrid of a storage device and memory module. Examples of a storage device include an SSD, a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), IoT enabled device, embedded computer (e.g., one included in a vehicle, industrial equipment, or a networked commercial device), or similar computing system that includes memory and a processing device.

The computing system 100 includes a host system 102 that is coupled to one or more memory sub-systems 104. In some embodiments, the host system 102 is coupled to different types of memory sub-systems 104. FIG. 1 illustrates one example of a host system 102 coupled to one memory sub-system 104. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

In at least one embodiment, the host system 102 is a computing device that controls a vehicle, such as an autonomous vehicle, and the memory sub-system 104 is an SSD that provides event recorder storage for the vehicle. For example, the memory sub-system 104 can store time based telemetric sensor data for the vehicle. Time based telemetric sensor data is defined in more detail with respect to FIG. 6. Embodiments are not limited to this example.

The host system 102 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, etc.). The host system 102 uses the memory sub-system 104, for example, to write data to the memory sub-system 104 and read data from the memory sub-system 104.

The host system 102 can be coupled to the memory sub-system 104 via a physical host interface. Examples of a physical host interface include, but are not limited to, a serial advanced technology attachment (SATA) interface, a PCIe interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 102 and the memory sub-system 104. The host system 102 can further utilize an NVM Express (NVMe) interface to access components (e.g., memory devices 116) when the memory sub-system 104 is coupled with the host system 102 by the PCIe interface. The physical host interface can provide an interface for passing control, address, data, and other signals between the memory sub-system 104 and the host system 102. FIG. 1 illustrates a memory sub-system 104 as an example. In general, the host system 102 can access multiple memory sub-systems via a same communication connection, multiple separate communication connections, and/or a combination of communication connections.

The host system 102 can send requests to the memory sub-system 104, for example, to store data in the memory sub-system 104 or to read data from the memory sub-system 104. The data to be written or read, as specified by a host request, is referred to as "host data." A host request can include logical address information. The logical address information can be a logical block address (LBA), which can include or be accompanied by a partition number. The logical address information is the location the host system associates with the host data. The logical address information can be part of metadata for the host data. The LBA can also correspond (e.g., dynamically map) to a physical address, such as a physical block address (PBA), that indicates the physical location where the host data is stored in memory.

Some examples of non-volatile memory devices (e.g., memory device 116) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 114 and 116 can include one or more arrays of memory cells. One method of operating a memory cell includes storing one-bit per cell, which is referred to as a single level cell (SLC). The "level" refers to the quantity of states to which the cell is programed, other than an erased state (level). An SLC can be programmed to one level other than the erased level. Other methods of operating memory cells include storing more than one bit per cell, such as multi-level cells (MLCs), triple level cells (TLCs), quad-level cells (QLCs), and penta-level cells (PLCs), among others. As used herein, "multi-level cells (MLCs)" refers to a memory cell that is programmable to two levels other than an erased level. In some embodiments, the non-volatile memory device 116 can include one or more arrays of memory cells such as SLCs, MLCs, TLCs, QLCs, PLCs, or any combination of such. In some embodiments, a particular memory device can include an SLC portion, and an MLC portion, a TLC portion, a QLC portion, or a PLC portion of memory cells. The memory cells of the non-volatile memory device 116 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 116 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 106 (or controller 106 for simplicity) can communicate with the memory device 116 to perform operations such as reading data, writing data, erasing data, and other such operations at the non-volatile memory device 116. The memory sub-system controller 106 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 106 can be a microcontroller, special purpose logic circuitry (e.g., a field programmable gate array (FPGA), an application specific integrated circuit (ASIC), etc.), or other suitable circuitry.

The memory sub-system controller 106 can include a processor 108 (e.g., a processing device) configured to execute instructions stored in a local memory 110. In the illustrated example, the local memory 110 of the memory sub-system controller 106 includes an embedded memory configured to store instructions for performing various processes, operations, logic flows, and routines that control operation of the memory sub-system 104, including handling communications between the memory sub-system 104 and the host system 102.

In some embodiments, the local memory 110 can include memory registers storing memory pointers, fetched data, etc.

The local memory 110 can also include ROM for storing micro-code, for example. While the example memory sub-system 104 in FIG. 1 has been illustrated as including the memory sub-system controller 106, in another embodiment of the present disclosure, a memory sub-system 104 does not include a memory sub-system controller 106, and can instead rely upon external control (e.g., provided by an external host, or by a processor or controller separate from the memory sub-system 104).

In general, the memory sub-system controller 106 can receive commands or operations from the host system 102 and can convert the commands or operations into instructions or appropriate commands to achieve the desired access to the memory device 116 and/or the memory device 114. The memory sub-system controller 106 can be responsible for other operations such as wear leveling operations, garbage collection operations, error detection and/or correction operations, encryption operations, caching operations, and address translations between a logical address (e.g., LBA, namespace) and a physical address (e.g., physical block address, physical media locations, etc.) associated with the memory device 116. The memory sub-system controller 106 can further include host interface circuitry to communicate with the host system 102 via the physical host interface. The host interface circuitry can convert the commands received from the host system 102 into command instructions to access the memory device 116 and/or the memory device 114 as well as convert responses associated with the memory device 116 and/or the memory device 114 into information for the host system 102.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 106 and decode the address to access the memory device 116 and/or the memory device 114.

In some embodiments, the memory device 116 includes a local media controller 118 that operates in conjunction with memory sub-system controller 106 to execute operations on one or more memory cells of the memory device 116. An external controller (e.g., memory sub-system controller 106) can externally manage the non-volatile memory device 116 (e.g., perform media management operations on the memory device 116). In some embodiments, a memory device 116 is a managed memory device, which is a raw memory device combined with a local controller (e.g., local controller 118) for media management within the same memory device package. An example of a managed memory device is a managed NAND (MNAND) device.

The memory sub-system controller 106 can also include touch up component 112. Although not shown in FIG. 1 so as to not obfuscate the drawings, the touch up component 112 can include various circuitry to facilitate performance of the operations described herein. For example, the touch up component 112 can include a special purpose circuitry in the form of an ASIC, FPGA, state machine, and/or other logic circuitry that can allow the touch up component 112 to orchestrate and/or perform the operations described herein. In some embodiments, a local media controller 118 of a non-volatile memory device 116 includes at least a portion of the touch up component 112. For example, the local media controller 118 can include a processor (e.g., processing device) configured to execute instructions stored on the memory device 114 for performing the operations described herein with respect to the touch up component 112. In some embodiments, the touch up component 112 is part of the host system 102, an application, or an operating system.

The touch up component 112 can be configured to cause different memory cells of the non-volatile memory device 116 to be operated with different programming characteristics. For example, memory cells storing a particular type of data (e.g., cyclic buffer data 222 illustrated in FIG. 2) can be programmed within a set of threshold voltage (Vt) distributions tailored to memory cell endurance, while memory cells storing a different type of data (e.g., snapshot data 224 illustrated in FIG. 2) can be programmed within a different set of Vt distributions tailored to data reliability.

The touch up component 112 can issue or cause to be issued a touch up command, which causes the memory device 116 (or portions thereof) to perform a particular programming operation, such as touch up operation. The touch up operation, when performed on memory cells of the memory device 116, can adjust the Vt of the memory cells that are already in the programmed state to a different Vt, for example, to a greater Vt, thus providing a greater voltage spread between the programmed state and the erased state, which provides a wider read window between the programmed state and the erased state. As used herein, the term "read window" refers to a distance (e.g., in voltage) between adjacent edges of a set of Vt distributions. As described herein, different read windows can be utilized to achieve different reliability and cell wear goals. For example, a larger read window can increase the data reliability as it can be easier to distinguish between adjacent Vt distributions distance by the larger read window, while a smaller read window can reduce the rate of memory cell degradation over a number of program/erase cycles, which increase the memory cell endurance, which indicates how reliably a memory cell operates after various quantities of program/erase cycles.

During the touch up operation, a particular amount of a programming signal and/or voltage can be applied to a memory cell and/or a group of memory cells that are already programmed to a particular data state. A memory cell of a particular non-volatile memory type, such a flash memory cell, can be required to be erased prior to being programmed to a different data state when the memory cell is already programmed to a particular data state. For example, in a NAND flash memory device, data can be written to the NAND flash memory device in a page unit, while data needs to be erased in a block unit such that every page within a same block needs to be erased together in order, for example, to program a single page of the block. In contrast, the touch up operation can adjust a range of voltage levels of a group of NAND flash memory cells that are already programmed to particular data states without disturbing/changing the data states (the programmed state is still the programmed state, it is merely further programmed) and/or without having to physically erase/move data stored in the group of memory cells, which provides benefits such as making programming characteristic adjustment of memory cells less time consuming as compared to those adjustments involving physical erasure/movement of data. Further details of read windows and/or performing touch up operations are described in connection with FIGS. 3-5.

Figure 2:
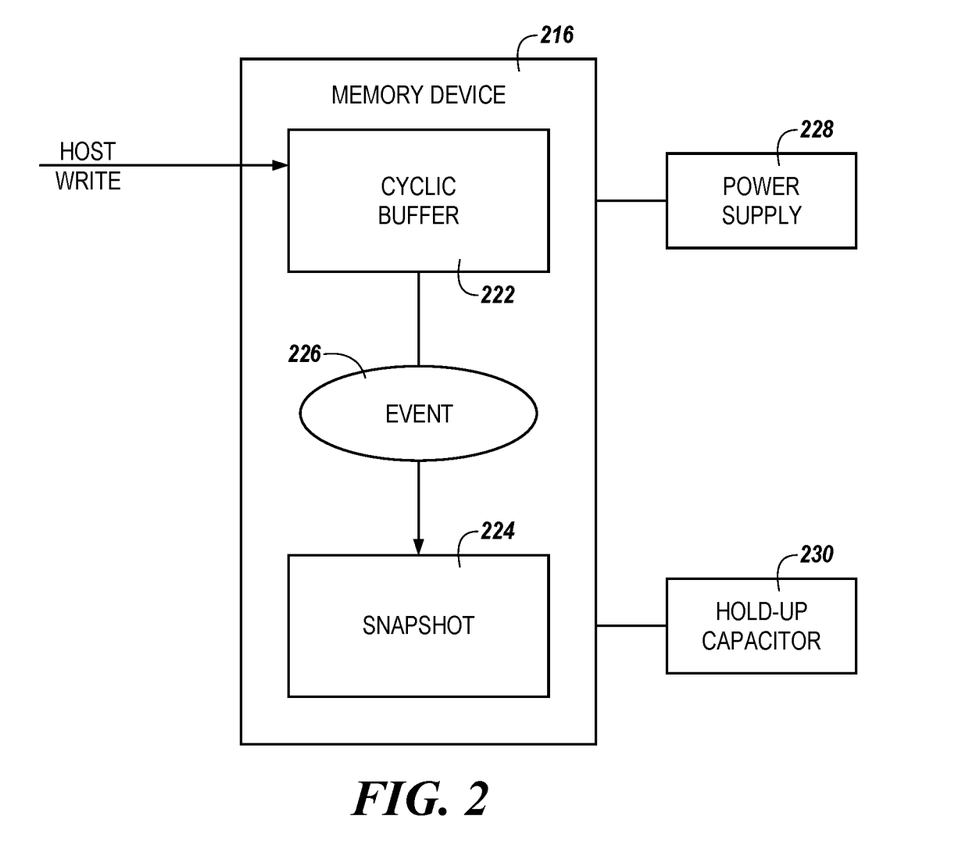
FIG. 2 illustrates an example of a memory device including a cyclic buffer and/or a snapshot in accordance with some embodiments of the present disclosure.

FIG. 2 illustrates an example of a memory device 216 including data corresponding to a cyclic buffer 222 and/or a snapshot 224 in accordance with some embodiments of the present disclosure. The memory device 216 is analogous to the non-volatile memory device 116 illustrated in FIG. 1. As illustrated in FIG. 2, host data can be received by the memory sub-system. The host data can be time based telemetric sensor data from different sensors of a vehicle. The time based telemetric sensor data from the different sensors can be aggregated by the host and sent to the memory sub-system at a data rate. The received host data can be stored in the non-volatile memory device 216 and a location of the non-volatile memory device 216 to which the received host data are written can be flagged as cyclic buffer or snapshot based at least in part on an operating target to be achieved with regards to the stored host data. As used herein, data stored in a location of the memory device 216 flagged as a cyclic buffer can be referred to as "cyclic buffer data" or "data corresponding to the cyclic buffer." Alternatively, data stored in a location of the memory device 216 flagged as a snapshot can be referred to as "snapshot data" or "data corresponding to the snapshot."

Prior to occurrence of the trigger event 226, the host data initially received at and stored in the memory device 216 can be cyclic buffer data. As locations of the memory device 216 are filled with cyclic buffer data, new cyclic buffer data is sequentially, but older cyclic buffer data in the memory device 216 can be erased or overwritten. Those locations storing cyclic buffer data can therefore operate as a first-in-first-out (FIFO) buffer, where newly received cyclic buffer data replaced the oldest cyclic buffer data therein.

The cyclic buffer portion 222 can store significantly more data over the service life of the non-volatile memory device 216 than the snapshot portion 224. For example, the cyclic buffer portion 222 can store 3-4 orders of magnitude (1,000-10,000 times) more data than the snapshot portion 224. However, the cyclic buffer portion 222 does not have to have a larger storage capacity than the snapshot portion 224. The size (amount of memory) of the cyclic buffer portion 222 can be dependent, at least in part, on an endurance capability of the cyclic buffer portion 222. For example, if a host is expected to write 150 petabytes (PB) of data to the cyclic buffer portion 222 (TBW is 150 PB) and the endurance capability of the cyclic buffer portion 222 is 5 million PEC, then 30 GB of memory for the cyclic buffer portion 222 is sufficient to satisfy the TBW of 150 PB, provided that data stored by the cyclic buffer portion 222 is overwritten. In contrast, if the endurance capability of the cyclic buffer portion 222 is 500 thousand PEC, then 300 GB of memory for the cyclic buffer portion 222 is necessary to satisfy the TBW of 150 PB. Thus, it can be beneficial to improve (increase) an endurance capability of the non-volatile memory device 216 (e.g., an endurance capability of the cyclic buffer portion 222) so that a higher TBW requirement can be satisfied with a smaller amount of memory. Reducing the amount of memory can reduce manufacturing costs, operating costs, and/or improve performance of the non-volatile memory device 216.

Upon occurrence of a trigger event 226, an amount of the time based telemetric sensor data corresponding to the cyclic buffer (e.g., cyclic buffer data 222) can be further programmed as/converted to the snapshot data 224. For example, upon occurrence of the trigger event 226, those locations storing cyclic buffer data that is to be converted to snapshot data can be flagged as a snapshot to convert the cyclic buffer data to the snapshot data. The amount of cyclic buffer data corresponding to a defined period of time, which can be referred to as a playback time (e.g., 30 seconds), is referred to as a snapshot size. The snapshot size can be predefined for a period of time immediately preceding a trigger event. The snapshot size and/or playback time can be a predefined value programmed to the memory sub-system by a manufacturer, supplier, or user of the memory sub-system. In some embodiments, the determination that the trigger event 226 has occurred can include actuation of a trigger signal based at least in part upon received sensor information from a host that is above a threshold, such as a quantitative value.

The memory sub-system can be configured to operate a location storing cyclic buffer data (e.g., the cyclic buffer data 222) with a read window tailored to an operating target for the cyclic buffer data. It is desirable for the location storing cyclic buffer data to have the ability to store data relatively quickly because it needs to be able to keep up with the host data rate and the throughput demands of the time based telemetric sensor data. It is further desirable for the same location to be able to handle a relatively large quantity of program/erase cycles compared to a location storing snapshot data. The operating target for cyclic buffer data (e.g., the cyclic buffer data 222) can be memory cell endurance. The memory sub-system can be configured to operate a location storing snapshot data (e.g., the snapshot 224) with a read window tailored to an operating target for the snapshot data. In some embodiments, the location storing snapshot data can be a location to which data are written during last 30 seconds prior to the trigger event. In contrast to the speed and endurance targets of cyclic buffer data, it is desirable for the snapshot to store data accurately and reliably because the snapshot data are intended to be recoverable after a trigger event. The operating target for snapshot data can be data reliability.

Converting cyclic buffer data (e.g., the cyclic buffer data 222) to snapshot data (e.g., the snapshot data 224) can be powered by a power supply 228 of the memory sub-system under normal circumstances. However, the conversion can be powered by a backup power supply, such as one or more hold-up capacitors 230 in response to a loss of system power (e.g., the power supply 228), which can be associated with the trigger event 226, which can be a host-triggered event including a vehicle accident. In at least one embodiment, the loss of power from the power supply 228 can be the trigger event 226. A size and/or quantity of the hold-up capacitor(s) 230 are sufficient to provide enough power to convert one snapshot from, for example, the cyclic buffer data 222 to the snapshot data 224. As illustrated, the power supply 228 and the hold-up capacitor 230 are coupled to the memory device 216, which indicates that the power supply 228 and the hold-up capacitor 230 are coupled to the memory device 216 to provide power therefor. In the event that there is no direct physical connection between either the power supply 228 or the hold-up capacitor 230 and the memory device 216, the power can be provided through write circuitry (not specifically illustrated).

Figure 3A:
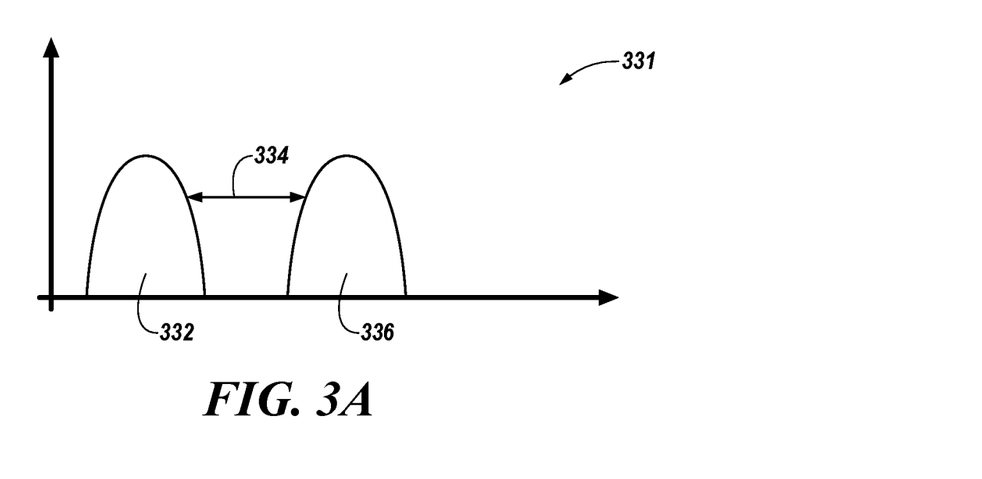
FIG. 3A illustrates a read window between threshold voltage distributions in accordance with some embodiments of the present disclosure.
Figure 3B:
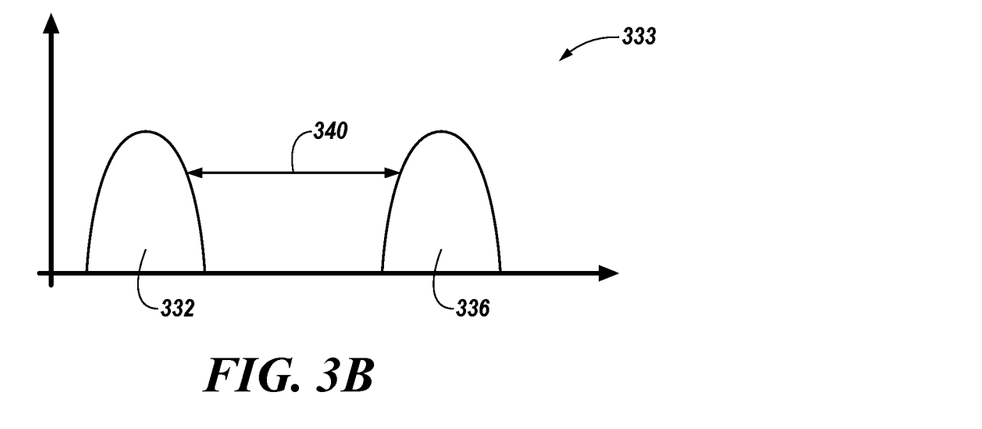
FIG. 3B illustrates a different read window between threshold voltage distributions in accordance with some embodiments of the present disclosure.

FIG. 3A and FIG. 3B illustrate respective graphs 331 and 333 showing read windows 334 and 340 between threshold voltage distributions in accordance with some embodiments of the present disclosure. Although not specifically labeled as such, the horizontal axis represents the charge or voltage of the memory cell (the threshold voltage) and the vertical axis represents the quantity of memory cells for each data state (e.g., 1 and 0) that are programmed to a particular target voltage. The curves for each data state (e.g., 1 and 0) therefore represent statistical distributions of memory cell threshold voltages for each data state.

The arrows 334 and 340 illustrated respectively in FIG. 3A and FIG. 3B are read windows indicating the distance between respective Vt distributions along the horizontal axis (e.g., in volts). For example, the read window 334 can be a distance (e.g., in voltage) between adjacent edges of the Vt distributions 332 and 336 as shown in FIG. 3A. Similarly, the read window 340 can be a distance (e.g., in voltage) between adjacent edges of the Vt distributions 332 and 340 as shown in FIG. 3B. Although the read windows 334 and 440 appear to be at a particular height along the vertical axis, they can represent any distance between the distributions, such as the worst case scenario at the bottom of each distribution where the distributions are widest and closest together.

The Vt distributions 332 and 336 of FIG. 3A can be analogous to Vt distributions 332 and 336, respectively, of FIG. 3B. For example, a data state indicated by the Vt distribution 332 can correspond to a data state indicated by the Vt distribution 332. Similarly, a data state indicated by the Vt distribution 336 can correspond to a data state indicated by the Vt distribution 336. As illustrated in FIG. 3A and FIG. 3B, the read window 340 can be larger (e.g., have a greater range of voltage levels) than the read window 334. Although embodiments are not so limited, Vt distributions 332 illustrated in FIG. 3A and FIG. 3B can correspond to an erased state.

Different read windows, such as read windows 334 and 340, can be used to operate a non-volatile memory device, such as memory device 116 illustrated in FIG. 1. For example, a location of the memory device 116 storing cyclic buffer data can be operated with a set of Vt distributions that provides a relatively small read window, such as the read window 334 and a location of the memory device 116 storing snapshot data can be operated with a set of Vt distributions that provides a relatively large read window, such as the read window 340. As described herein, the location storing cyclic buffer data has relatively relaxed reliability requirements in comparison to the location storing snapshot data. A smaller spread of threshold voltages (Vt) between data states, which is referred to herein as a read window, reduces the data reliability because it can be more difficult to distinguish between the data states. However, the smaller read window also reduces the rate of memory cell degradation over a number of program/erase cycles, which increases the memory cell endurance.

In some embodiments, the touch up operation performed on a group of memory cells can adjust a Vt distribution of only those memory cells programmed within a particular one of the Vt distributions. For example, assuming that Vt distributions 332 and 332 indicates a same data value (e.g., a logic value of "1") and Vt distributions 336 and 336 indicates a same data value (e.g., a logic value of "0"), the touch up operation performed on a group of memory cells having a set of Vt distributions 332 and 336 can result in a larger read window by increasing a range of voltage levels of Vt 336 to Vt 336, while a range of voltage levels of Vt 332 remains substantially same to that of Vt 332. Stated alternatively, the touch up operation can selectively apply a programming signal/voltage to only those memory cells in a particular programmed state or having a particular data value.

Figure 4:
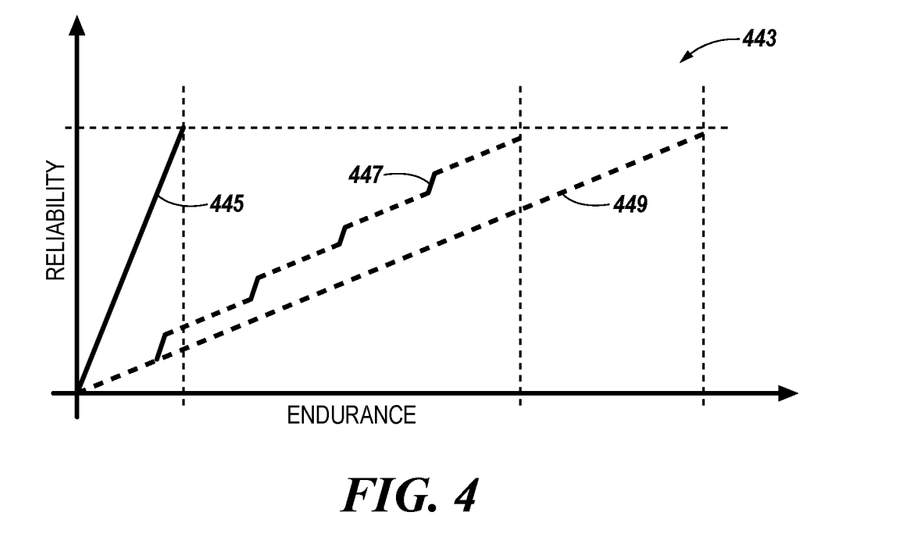
FIG. 4 is a plot demonstrating various strategies for achieving different operating targets in accordance with some embodiments of the present disclosure.

FIG. 4 is a plot 443 demonstrating various strategies for achieving different operating targets in accordance with some embodiments of the present disclosure. As illustrated in FIG. 4, the vertical axis indicates the reliability and the horizontal axis indicates the endurance.

As shown by 445, 447, and 449, higher reliability can be achieved at the cost of the endurance, while higher endurance can be achieved at the cost of the reliability. For example, operating a NAND memory device (e.g., the non-volatile memory device 116 illustrated in FIG. 1) according to the strategy 445 can yield in higher reliability than when operating the NAND memory device according to the strategy 449, which, however, can yield higher endurance than when operating the NAND memory device according to the strategy 445. Although embodiments are not so limited, the strategy 445 (solid line) can be used to operate a portion of the memory device that stores snapshot data (e.g., the snapshot data 224 illustrated in FIG. 2) and the strategy 449 (dotted line) can be used to operate a portion of the memory device that stores cyclic buffer data (e.g., cyclic buffer data 222 illustrated in FIG. 2).

In some embodiments, reliability and endurance can be alternatively pursued by changing strategies for operating a NAND memory device. As indicated by the strategy 447, for example, a NAND memory device that has been operating according to the strategy 445 (as shown by a solid line in the strategy 447) can be operated according to the strategy 449 (as shown by a dotted line in the strategy 447), which can be alternatively repeated to achieve higher endurance than when operating the NAND memory device 445 and to further achieve higher reliability than when operating the NAND memory device 449.

Considering an example where the TBW is 150 PB and 10 snapshots (each having a size of 30 GB) are taken daily. In this example, a total size of 0.6 PB are exhausted for taking approximately 20000 snapshots over a warranty period of, for example, 5 years of the event recorder. Because 0.6 PB are considerably smaller compared to the TBW of 150 petabytes, exhausting every 150 PB data with relatively high reliability (e.g., as indicated by the strategy 445) can unnecessarily sacrifice the endurance of the event recorder when non-snapshot data need not be written with the higher reliability. Therefore, the strategy 447 can be utilized to pursue higher reliability only for the snapshots, while normally operating the memory device with pursuit of higher endurance, which eliminates unnecessary sacrifice of the endurance of the event recorder.

Figure 5:
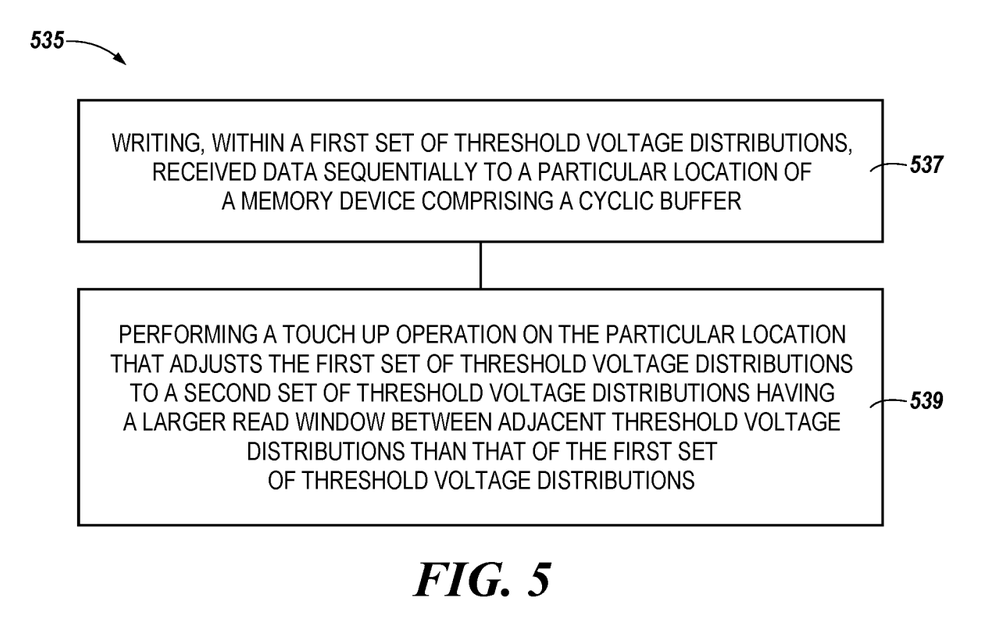
FIG. 5 is a flow diagram of an example method for adjusting threshold voltage distributions for buffer and snapshot in accordance with some embodiments of the present disclosure.

FIG. 5 is a flow diagram of an example method 535 for adjusting threshold voltage (Vt) distributions for buffer and snapshot in accordance with some embodiments of the present disclosure. The method can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method is performed by or using the memory sub-system controller 106, processing device 108, touch up component 112, non-volatile memory device 116 and/or volatile memory device 114, and/or local media controller 118 shown in FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 537 of the example method 535, data can be sequentially written to a particular location of a cyclic buffer (e.g., the cyclic buffer 222 illustrated in FIG. 2) of a memory device (e.g., the non-volatile memory device 116 illustrated in FIG. 1) within a first set of Vt distributions.

At block 539 of the example method 535, a touch up operation can be performed on the data to adjust the first set of threshold voltage distributions to a second set of threshold voltage distributions. The touch up operation can be performed in response to a trigger event. The second set of Vt distributions can have a read window larger than that of the first set of Vt distributions. Once the touch up operation is performed on the particular location, the data stored in the particular location are programmed within the second set of Vt distributions and the particular location having the newly adjusted data can be flagged as a snapshot. Accordingly, cyclic buffer data (e.g., cyclic buffer data 222) desired to be preserved as snapshot data (e.g., snapshot data 224) in response to the trigger event can be converted to the snapshot data without physically moving the data within a memory device (e.g., the memory device 216 illustrated in FIG. 2).

In some embodiments, adjusting Vt distributions of data associated with a trigger event can involve physical movement of the data from one location to another. For example, in response to the trigger event, the data can be retrieved to a processing device (e.g., processor 108 illustrated in FIG. 1) from a location of the memory device 116 flagged as cyclic buffer and the data can be written back to a location (that is physically different location than a location corresponding to the cyclic buffer) flagged as/to be flagged as snapshot according to a Vt distributions having a larger read window.

In some embodiments, power can be provided from a hold-up capacitor (e.g., the hold-up capacitor 230 illustrated in FIG. 2) in response to a loss of system power associated with the trigger event at least while the touch up operation is being performed. Further, in some embodiments, memory cells of the cyclic buffer can be operated in a SLC mode. However, memory cells of the cyclic buffer are not limited to a particular mode. For example, the memory cells of the cyclic buffer can also be operated according to a non-SLC mode, such as MLC, TLC, QLC, PLC, etc.

Figure 6:
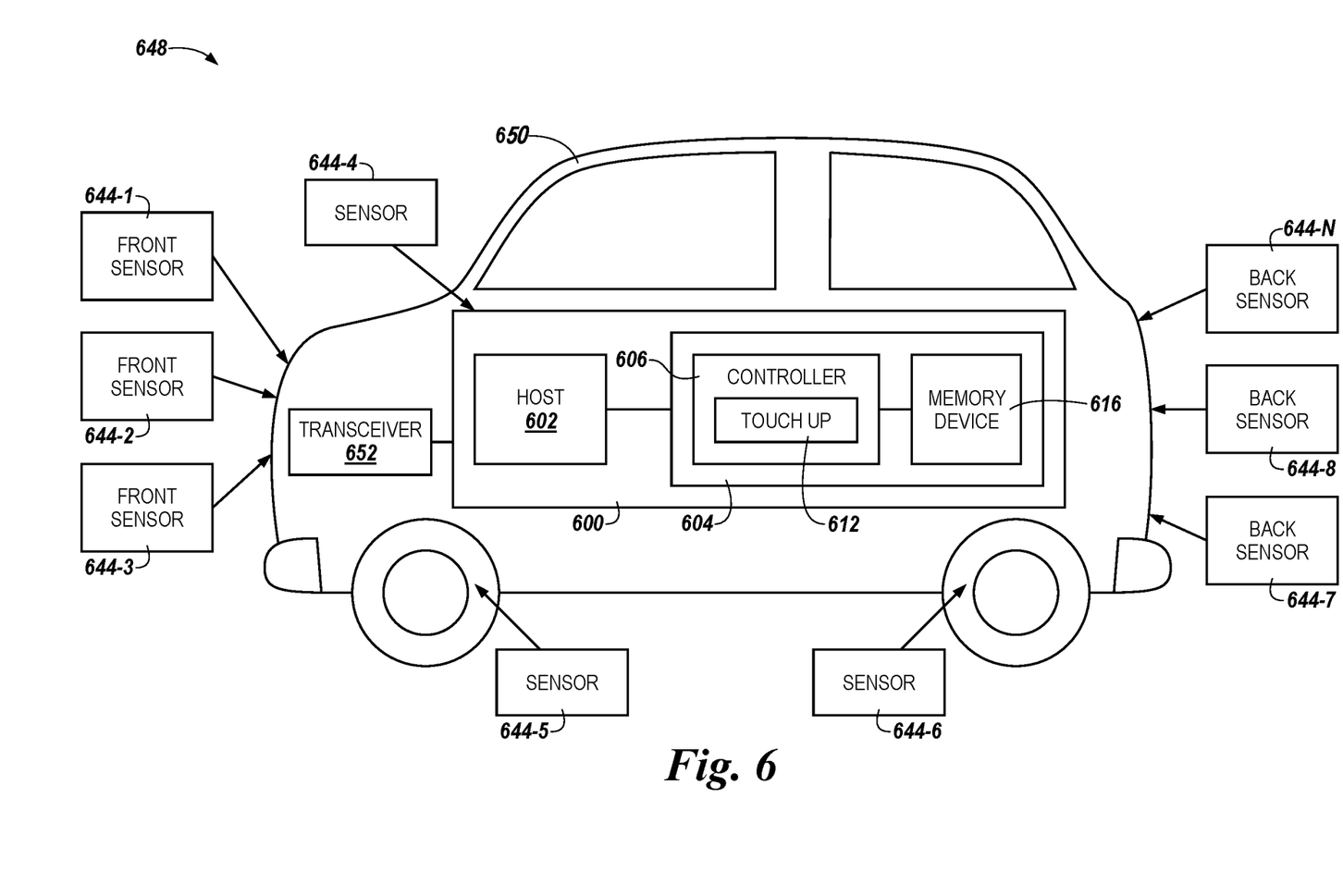
FIG. 6 illustrates an example of a system including a computing system in a vehicle in accordance with some embodiments of the present disclosure.

FIG. 6 illustrates an example of a system 648 including a computing system 600 in a vehicle 650 in accordance with some embodiments of the present disclosure. The computing system 600 can include a memory sub-system 604, which is illustrated as including a controller 606 and non-volatile memory device 616 for simplicity but is analogous to the memory sub-system 104 illustrated in FIG. 1. The controller 606 can be analogous to the memory sub-system controller 106 illustrated in FIG. 1. The controller 606 can further include a touch up component 612 respectively within the controller 606. As described herein, the touch up component 612, in some embodiments, can cause the controller 606 to perform write actions, e.g., issue write commands, to control host data movement between one memory portion (e.g., cyclic buffer partition portion 241-1 illustrated in FIG. 2), and the other memory portion (e.g., snapshot partition portion 214-2 illustrated in FIG. 2) and/or to perform a touch up operation as described herein.

The computing system 600, and thus the host 602, can be coupled to a number of sensors 644 either directly, as illustrated for the sensor 644-4 or via a transceiver 652 as illustrated for the sensors 644-1, 644-2, 644-3, 644-5, 644-6, 644-7, 644-8, . . . , 644-N. The transceiver 652 is able to receive time based telemetric sensor data from the sensors 644 wirelessly, such as by radio frequency communication. In at least one embodiment, each of the sensors 644 can communicate with the computing system 600 wirelessly via the transceiver 652. In at least one embodiment, each of the sensors 644 is connected directly to the computing system 600 (e.g., via wires or optical cables). As used herein, telemetric sensor data means that the data is collected by sensors 644 that are remote from the memory sub-system 604 that stores the data (the receiving equipment). The telemetric sensor data is time based because the data is correlated with time. The time corresponding to each data point can either be stored with the telemetric data or derivable therefrom based on some metric, such as a known start time for the data and a data rate. The time can be useful in the playback of the sequences preceding an accident, for example.

The vehicle 650 can be a car (e.g., sedan, van, truck, etc.), a connected vehicle (e.g., a vehicle that has a computing capability to communicate with an external server), an autonomous vehicle (e.g., a vehicle with self-automation capabilities such as self-driving), a drone, a plane, a ship, and/or anything used for transporting people and/or goods. The sensors 644 are illustrated in FIG. 6 as including example attributes. For example, sensors 644-1, 644-2, and 644-3 are camera sensors collecting data from the front of the vehicle 650. Sensors 644-4, 644-5, and 644-6 are microphone sensors collecting data from the front, middle, and back of the vehicle 650. The sensors 644-7, 644-8, and 644-N are camera sensors collecting data from the back of the vehicle 650. As another example, the sensors 644-5, 644-6 are tire pressure sensors. As another example, the sensor 644-4 is a navigation sensor, such as a global positioning system (GPS) receiver. As another example, the sensor 644-6 is a speedometer. As another example, the sensor 644-4 represents a number of engine sensors such as a temperature sensor, a pressure sensor, a voltmeter, an ammeter, a tachometer, a fuel gauge, etc. As another example, the sensor 644-4 represents a video camera.

In some embodiments, the system 600 can be related to a braking system of the vehicle and can receive time based telemetric sensor data from to the camera sensors 644, the temperature sensors 644, and/or acoustic sensors 644. In some embodiments, the system 600 can be related to a heating/cooling system of the vehicle and can receive time based telemetric sensor data from temperature sensors 644 and/or acoustic sensors 644. In some embodiments, the system 600 can be related to an ambient noise system and can receive time based telemetric sensor data from acoustic sensors 644.

The host 602 can execute instructions to provide an overall control system and/or operating system for the vehicle 650. The host 602 can be a controller designed to assist in automation endeavors of the vehicle 650. For example, the host 602 can be an advanced driver assistance system controller (ADAS). An ADAS can monitor data to prevent accidents and provide warning of potentially unsafe situations. For example, the ADAS can monitor sensors in the vehicle 650 and take control of vehicle 650 operations to avoid accident or injury (e.g., to avoid accidents in the case of an incapacitated user of a vehicle). The host 602 can be desired to act and make decisions quickly to avoid accidents. The memory sub-system 604 can store reference data in the non-volatile memory device 616 such that time based telemetric sensor data from the sensors 644 can be compared to the reference data by the host 602 in order to make quick decisions.

Figure 7:
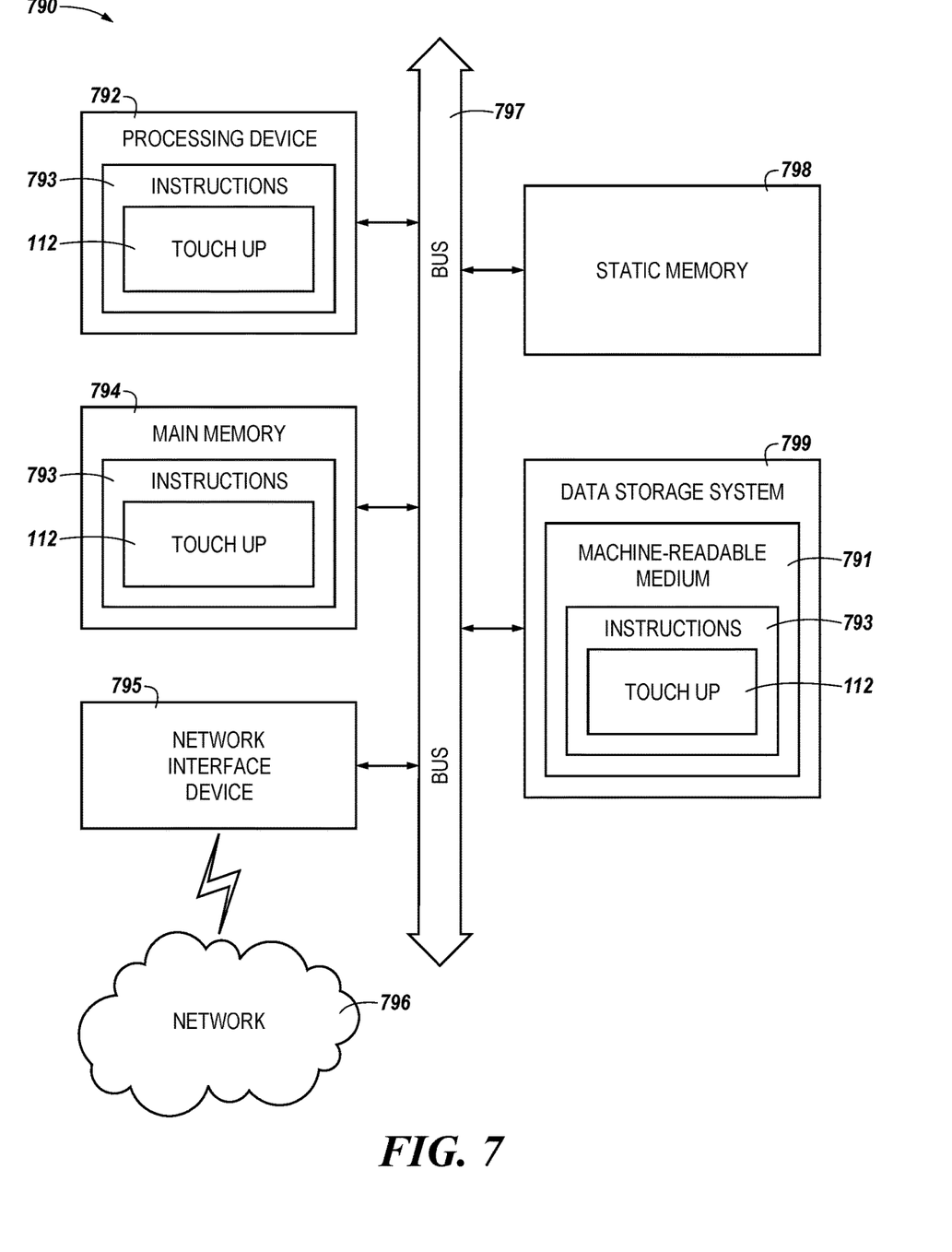
FIG. 7 is a block diagram of an example computer system in which embodiments of the present disclosure may operate.

FIG. 7 illustrates an example machine of a computer system 790 within which a set of instructions, for causing the machine to perform one or more of the methodologies discussed herein, can be executed. In some embodiments, the computer system 790 can correspond to a host system (e.g., the host system 120 of FIG. 1) that includes, is coupled to, or utilizes a memory sub-system (e.g., the memory sub-system 104 of FIG. 1) or can be used to perform the operations of a controller (e.g., to execute an operating system to perform operations corresponding to the touch up component 112 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or another machine capable of executing a set of instructions (sequential or otherwise) that specify actions to be taken by that machine. Further, while a single machine is illustrated, the term "machine" shall also be taken to include a collection of machines that individually or jointly execute a set (or multiple sets) of instructions to perform one or more of the methodologies discussed herein.

The example computer system 790 includes a processing device 792, a main memory 794 (e.g., read-only memory (ROM), flash memory, dynamic random access memory (DRAM) such as synchronous DRAM (SDRAM) or Rambus DRAM (RDRAM), etc.), a static memory 798 (e.g., flash memory, static random access memory (SRAM), etc.), and a data storage system 799, which communicate with each other via a bus 730.

The processing device 792 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 792 can also be one or more special-purpose processing devices such as an application specific integrated circuit (ASIC), a field programmable gate array (FPGA), a digital signal processor (DSP), network processor, or the like. The processing device 792 is configured to execute instructions 793 for performing the operations and steps discussed herein. The computer system 741 can further include a network interface device 795 to communicate over the network 796.

The data storage system 799 can include a machine-readable storage medium 791 (also known as a computer-readable medium) on which is stored one or more sets of instructions 793 or software embodying one or more of the methodologies or functions described herein. The instructions 793 can also reside, completely or at least partially, within the main memory 794 and/or within the processing device 792 during execution thereof by the computer system 741, the main memory 794 and the processing device 792 also constituting machine-readable storage media. The machine-readable storage medium 791, data storage system 799, and/or main memory 794 can correspond to the memory sub-system 104 of FIG. 1.

In one embodiment, the instructions 793 include instructions to implement functionality corresponding to a touch up component (e.g., touch up component 112 of FIG. 1). While the machine-readable storage medium 791 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform one or more of the methodologies of the present disclosure. The term "machine-readable storage medium"

shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, read-only memories (ROMs), random access memories (RAMs), EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
a memory device; and
a processing device communicatively coupled to the memory device, wherein the processing device is to:
write, within a first set of threshold voltage distributions, received data to the memory device; and
perform, in response to a determination that a trigger event has occurred, a touch up operation on the memory device that adjusts the first set of threshold voltage distributions to a second set of threshold voltage distributions having a larger read window between adjacent threshold voltage distributions than that of the first set of threshold voltage distributions.

2. The apparatus of claim 1, wherein the processing device is to perform the touch up operation to adjust a read window between adjacent threshold voltage distributions corresponding to the data, while maintaining data states of the data.

3. The apparatus of claim 1, wherein memory cells of the memory device are programmable to a first data state or a second data state and the processing device is to perform the touch up operation on only those memory cells of the memory device in the first data state.

4. The apparatus of claim 3, wherein the processing device is to adjust a threshold voltage of those memory cells in the first data state to a higher threshold voltage.

5. The apparatus of claim 1, wherein a read window is a distance between adjacent edges of respective voltage distributions of the first set of threshold voltage distributions or the second set of threshold voltage distributions.

6. The apparatus of claim 1, wherein:
the first set of threshold voltage distributions is tailored to endurance of the memory device; and
the second set of threshold voltage distributions is tailored to reliability of the memory device.

7. The apparatus of claim 1, wherein:
a location of the memory device configured for the data corresponds to a block of NAND memory cells; and
the processing device is to perform a touch up operation on each page of the block of NAND memory cells.

8. An apparatus, comprising:
a memory device; and a processing device communicatively coupled to the memory device, the processing device to:
write cyclic buffer data to the memory device within a first set of threshold voltage distributions; and convert, in response to a trigger event, the cyclic buffer data to snapshot data by performing a touch up operation on the cyclic buffer data to adjust the first set of threshold voltage distributions to a second set of threshold voltage distributions having a larger read window between adjacent threshold voltage distributions than that of the first set of threshold voltage distributions.

9. The apparatus of claim 8, wherein the processing device is to operate, prior to the trigger event, a location of the memory device configured for the cyclic buffer data as a first-in-first-out (FIFO) buffer.

10. The apparatus of claim 8, wherein the touch operation performed on the cyclic buffer data adjusts a read window between respective threshold voltage distributions associated with the cyclic buffer data without the cyclic buffer data being erased.

11. The apparatus of claim 10, wherein the memory device comprises NAND flash memory cells.

12. The apparatus of claim 8, wherein the cyclic buffer data corresponds to an amount of time-based telemetric sensor data predefined for a period of time immediately preceding the trigger event.

13. The apparatus of claim 8, further comprising a primary power supply and a backup power supply coupled to the memory device, and wherein the processing device is configured to convert the cyclic buffer data to the snapshot data, while being powered by the primary power supply.

14. The apparatus of claim 13, wherein the processing device is configured to convert the cyclic buffer data to the snapshot data, while being powered by the backup power supply in response to a loss of the primary power supply.

15. The apparatus of claim 8, further comprising trigger circuitry to signal the processing device in response to the trigger event.

16. The apparatus of claim 8, wherein the memory device is an event recorder storage device for an autonomous vehicle.

17. A method, comprising:
    operating a location of a memory device configured for cyclic buffer data with a first set of threshold voltage distributions; and
    converting, in response to a trigger event, the cyclic buffer data to snapshot data by operating the location of the memory device with a second set of threshold voltage distributions.

18. The method of claim 17, further comprising converting the cyclic buffer data to the snapshot data without disturbing data states of the cyclic buffer data.

19. The method of claim 17, further comprising converting the cyclic buffer data to the snapshot data without physically erasing the cyclic buffer data.

20. The method of claim 17, further comprising flagging, subsequent to converting to the snapshot data, the location as storing the snapshot data.

* * * * *